United States Patent
Byun

(10) Patent No.: US 8,031,553 B2
(45) Date of Patent: Oct. 4, 2011

(54) DATA STROBE SIGNAL GENERATING DEVICE AND A SEMICONDUCTOR MEMORY APPARATUS USING THE SAME

(75) Inventor: Hee-Jin Byun, Ichon (KR)

(73) Assignee: Hynix Semiconductor Inc. (KR)

( * ) Notice: Subject to any disclaimer, the term of this patent is extended or adjusted under 35 U.S.C. 154(b) by 162 days.

(21) Appl. No.: 12/346,986

(22) Filed: Dec. 31, 2008

(65) Prior Publication Data

US 2010/0091591 A1 Apr. 15, 2010

(30) Foreign Application Priority Data

Oct. 13, 2008 (KR) .................. 10-2008-0100257

(51) Int. Cl.
*G11C 8/00* (2006.01)
(52) U.S. Cl. ..................... 365/233.1; 365/193
(58) Field of Classification Search ............... 365/233.5
See application file for complete search history.

(56) References Cited

U.S. PATENT DOCUMENTS

| 7,230,466 B2 | 6/2007 | Park |
| 2001/0012234 A1* | 8/2001 | Keeth et al. ............... 365/233.5 |
| 2007/0291558 A1 | 12/2007 | Joo |

FOREIGN PATENT DOCUMENTS

| JP | 2006-120307 | 11/2006 |
| JP | 2008-198356 | 8/2008 |
| KR | 1020030078307 | 10/2003 |
| KR | 100535649 | 2/2005 |
| KR | 10-2006-0101988 | 10/2006 |

* cited by examiner

*Primary Examiner* — Jason Lappas
(74) *Attorney, Agent, or Firm* — Baker & McKenzie LLP

(57) ABSTRACT

A data strobe signal generating device includes a preamble controller configured to generate a preamble signal enabled in synchronization with a first clock signal and disabled in synchronization with a second clock signal after an output enable signal is enabled, and a data strobe signal output unit configured to generate a data strobe signal in response to the preamble signal.

11 Claims, 6 Drawing Sheets

DATA STROBE SIGNAL GENERATING DEVICE AND A SEMICONDUCTOR MEMORY APPARATUS USING THE SAME

CROSS-REFERENCES TO RELATED APPLICATION

The present application claims priority under 35 U.S.C. 119(a) to Korean application number 10-2008-0100257, filed on Oct. 13, 2008, in the Korean Intellectual Property Office, which is incorporated herein by reference in its entirety as if set forth in full.

BACKGROUND

1. Technical Field

The embodiments described herein relate to a data strobe signal generating device, and more particularly, to a data strobe signal generating device and a semiconductor memory apparatus is using the same.

2. Related Art

In general, a synchronous semiconductor memory apparatus, such as a double data rate synchronous dynamic random access memory (DDR SDRAM), uses a data strobe signal 'DQS' serving as a reference for a data strobing time point. The data strobe signal 'DQS' has a preamble, which represents the start of a read or write operation of a semiconductor memory apparatus, and a postamble that represents the end of the read or write operation. If the preamble and the postamble of the data strobe signal 'DQS' are not normally generated, a signal may not be normally exchanged between a controller and the semiconductor memory apparatus.

FIG. 1 is a schematic block diagram of a conventional data strobe signal generating device. In FIG. 1, the data strobe signal generating device 1 includes an enable signal generator 10, a preamble pulse generator 20, and a data strobe signal output unit 30.

The enable signal generator 10 receives first and second output enable signals 'OE1' and 'OE2' to generate an enable signal 'QSENPRE'. The first output enable signal 'OE1' is enabled prior to a CAS latency by a 1.5 clock signal and the second output enable signal 'OE2' is enabled prior to the CAS latency by a 0.5 clock signal. Thus, the enable signal 'QSENPRE' is enabled for one period of a clock signal.

The data strobe signal output unit 30 receives the enable signal 'QSENPRE' and a delay locked loop (DLL) clock signal 'dll_clk' to generate a preamble signal 'QSPRECLK'. The data strobe signal output unit 30 receives the preamble signal 'QSPRECLK' to generate a data strobe signal 'DQS'.

FIG. 2 is a schematic circuit diagram a conventional data strobe signal output unit of FIG. 1. In FIG. 2, the data strobe signal output unit 30 includes first and second PMOS transistors P1 and P2, a first NMOS transistor N1, and first to third inverters IV1 to IV3. The data strobe signal output unit 30 enables a down-signal 'dn' in response to the preamble signal 'QSPRECLK', thereby generating a preamble of the data strobe signal 'DQS'.

FIG. 3 is a timing chart of a conventional data strobe signal generating device of FIG. 1. In FIG. 3, the enable signal generator 10 receives the first and second output enable signals 'OE1' and 'OE2' to generate the enable signal 'QSENPRE' having an enable interval corresponding to one period of a clock signal.

The preamble pulse generator 20 (in FIG. 1) generates the preamble signal 'QSPRECLK' enabled at a low level by a pulse width of the DLL clock signal 'dll_clk' input in an interval in which the enable signal 'QSENPRE' is enabled.

The data strobe signal output unit 30 receives the preamble signal 'QSPRECLK' at the low level to generate the down-signal 'dn' enabled at a high level, thereby generating the preamble of the data strobe signal 'DQS'.

However, in a semiconductor memory apparatus, the enable signal 'QSENPRE' may not be enabled at normal timing due to process, voltage, temperature (PVT) variations or layout loading.

FIG. 4 is a schematic block diagram of a conventional data strobe signal generating device including a layout loading. In FIG. 4, high loading exists in a circuit until the enable signal 'QSENPRE' is input to the preamble pulse generator 20 after the enable signal 'QSENPRE' is generated from the enable signal generator 10. Here, the layout loading 40 is shown.

FIG. 5 is a timing chart of a conventional operation of the data strobe signal generating device of FIG. 4. In FIG. 5, the enable signal 'QSENPRE' is enabled after being delayed from the original enable time point due to the layout loading 40 (in FIG. 4). In such a case, since the enable signal 'QSENPRE' does not sufficiently cover the DLL clock signal 'dll_clk', the preamble pulse generator 20 (in FIG. 4) generates the preamble signal 'QSPRECLK' having a narrower pulse width, so that the preamble of the data strobe signal 'DQS' may not be normally generated. Accordingly, the semiconductor memory apparatus will not function properly.

SUMMARY

A data strobe signal generating device capable of stably generating a preamble of a data strobe signal and a semiconductor memory apparatus using the same are described herein.

In one aspect, a data strobe signal generating device includes a preamble controller configured to generate a preamble signal enabled in synchronization with a first clock signal and disabled in is synchronization with a second clock signal after an output enable signal is enabled, and a data strobe signal output unit configured to generate a data strobe signal in response to the preamble signal.

In another aspect, a data strobe signal generating device includes an enable unit configured to receive an output enable signal, and first and second clock signals to generate first and second enable signals enabled at a predetermined time interval, a preamble pulse generator configured to receive the first and second enable signals to generate a preamble signal, and a data strobe signal output unit configured to receive the preamble signal to generate a data strobe signal.

In another aspect, a semiconductor memory apparatus includes a clock generator configured to generate first and second clock signals toggled in synchronization with an external clock signal, and a data strobe signal generator configured to receive an output enable signal and the first and second clock signals to generate a preamble signal enabled for a predetermined time, and to generate a data strobe signal in response to the preamble signal.

In another aspect, a semiconductor memory apparatus includes a clock generator generating first and second clock signals toggled in synchronization with an external clock signal, a preamble controller generating a preamble signal enabled in synchronization with the first clock signal and disabled in synchronization with the second clock signal after an output enable signal is enabled, and a data strobe signal output unit generating a data strobe signal in is response to the preamble signal.

These and other features, aspects, and embodiments are described below in the section entitled "Detailed Description."

BRIEF DESCRIPTION OF THE DRAWINGS

Features, aspects, and embodiments are described in conjunction with the attached drawings, in which.

DETAILED DESCRIPTION

Figure 6:
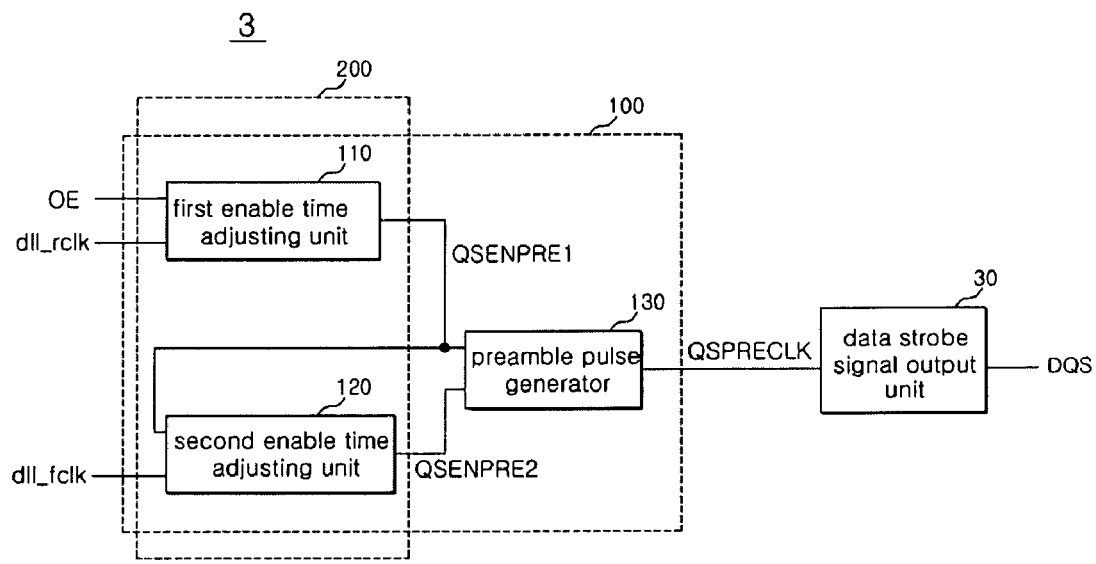
FIG. 6 is a schematic block diagram of an exemplary data strobe signal generating device according to one embodiment.

FIG. 6 is a schematic block diagram of an exemplary data strobe signal generating device according to one embodiment. In FIG. 6, the data strobe signal generating device 3 can be configured to include a preamble controller 100 and a data strobe signal output unit 30.

The preamble controller 100 can be configured to generate a preamble signal 'QSPRECLK' enabled in synchronization with a first clock signal 'dll_rclk', and disabled in synchronization with a second clock signal 'dll_fclk' after an output enable signal 'OE' is enabled. For example, the output enable signal 'OE' can represent signals enabled in synchronization with a read command, and delayed by a unit time when a semiconductor memory apparatus performs a read operation. Here, if the read command is input, then output enable signals are enabled at a unit time interval.

In FIG. 6, the output enable signal 'OE' can use a signal enabled prior to a CAS latency by a predetermined time. For example, the output enable signal 'OE' can include a signal enabled prior to a CAS latency by a 1.5 clock signal. Here, a synchronous DRAM inevitably has a data access time (tAA) from a memory cell to a data output control block when performing a read operation. Accordingly, the synchronous DRAM operating at a high frequency receives a read command to output data delayed by the number of clock signals corresponding to the CAS latency. Thus, the data strobe is signal generating device 3 can generate a preamble of a data strobe signal 'DQS' using the output enable signal 'OE' enabled prior to the CAS latency by a predetermined time.

In FIG. 6, the first and second clock signals 'dll_rclk' and 'dll_fclk' can be generated from a DLL clock generating circuit. In general, a semiconductor memory apparatus generates a DLL clock synchronizing with an external clock signal, thereby driving a circuit operating in synchronization with the DLL clock. The first and second clock signals 'dll_rclk' and 'dll_fclk' can be toggled in synchronization with the external clock signal. Accordingly, the first and second clock signals 'dll_rclk' and 'dll_fclk' denote a pair of clock signals having a phase difference of about 180° (degrees) therebetween.

In FIG. 6, the preamble controller 100 can include a first enable time adjusting unit 110, a second enable time adjusting unit 120 and a preamble pulse generator 130.

The first enable time adjusting unit 110 can be configured to receive the output enable signal 'OE' and the first clock signal 'dll_rclk' to generate a first enable signal 'QSENPRE1'. After the output enable signal 'OE' is enabled, the first enable time adjusting unit 110 can be synchronized with a rising edge of the first clock signal 'dll_rclk' to enable the first enable signal 'QSENPRE1'.

The second enable time adjusting unit 120 can be configured to receive the first enable signal 'QSENPRE1' and the second clock signal 'dll_fclk' to generate a second enable signal 'QSENPRE2'. After the first enable signal 'QSENPRE1' is enabled, the is second enable time adjusting unit 120 can be synchronized with a rising edge of the second clock signal 'dll_fclk' to enable the second enable signal 'QSENPRE2'.

The preamble pulse generator 130 can be configured to receive the first and second enable signals 'QSENPRE1' and 'QSENPRE2' to generate the preamble signal 'QSPRECLK'. For example, the preamble pulse generator 130 can generate the preamble signal 'QSPRECLK' enabled from the time point at which the first enable signal 'QSENPRE1' is enabled to the time point at which the second enable signal 'QSENPRE2' is enabled.

The data strobe signal output unit 30 can be configured to receive the preamble signal 'QSPRECLK' and an up-signal 'up' enabled based on the CAS latency to generate the data strobe signal 'DQS'.

In addition, the data strobe signal generating device 3 an also include an enable unit 200, the preamble pulse generator 130, and the data strobe signal output unit 30, wherein the enable unit 200 can include the first and second enable time adjusting units 110 and 120.

Figure 7:
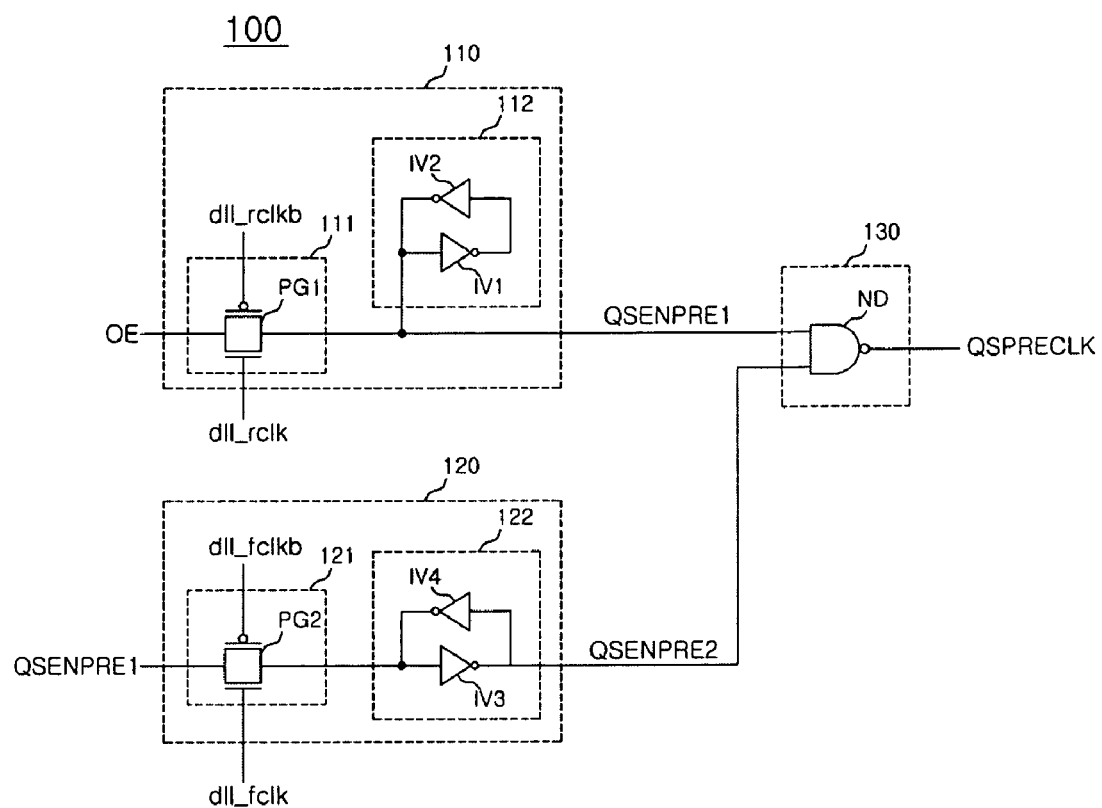
FIG. 7 is a schematic circuit diagram of an exemplary to preamble controller capable of being implemented in the device of FIG. 6 according to one embodiment.

FIG. 7 is a schematic circuit diagram of an exemplary preamble controller capable of being implemented in the device of FIG. 6 according to one embodiment. In FIG. 7, the preamble controller 100 can include the first and second enable time adjusting units 110 and 120 and the preamble pulse generator 130.

The first enable time adjusting unit 110 can include a first transmission unit 111 and a first latch unit 112. Here, for example, is the first transmission unit 111 can be configured to receive the output enable signal 'OE' and allow the output enable signal 'OE' to pass therethrough in synchronization with the rising edge of the first clock signal 'dll_rclk', thereby generating the first enable signal 'QSENPRE1'. In addition, the first latch unit 112 can be configured to maintain a level of the first enable signal 'QSENPRE1'.

The second enable time adjusting unit 120 can include a second transmission unit 121 and a second latch unit 122. Here, for example, the second transmission unit 121 can be configured to receive the first enable signal 'QSENPRE1' to allow the first enable signal 'QSENPRE1' to pass therethrough in synchronization with the rising edge of the second clock signal 'dll_fclk'. In addition, the second latch unit 122 can be configured to invert output of the second transmission unit 121, thereby generating the second enable signal 'QSENPRE2' and simultaneously maintaining a level of the second enable signal 'QSENPRE2'.

The first and second transmission units 111 and 121 can be configured, for example, as pass gates PG1 and PG2 using the first and second clock signals 'dll_rclk' and 'dll_fclk' as control signals, respectively. The first latch unit 112 can include two inverters IV1 and IV2 that can maintain the level of the first enable signal 'QSENPRE1', and the second latch unit 122 can include two inverters IV3 and IV4 that can maintain the level of the second enable signal 'QSENPRE2'.

In addition, the preamble pulse generator 130 can include is an NAND gate ND for receiving the first and second enable signals 'QSENPRE1' and 'QSENPRE2' to generate the preamble signal 'QSPRECLK'.

Figure 1:
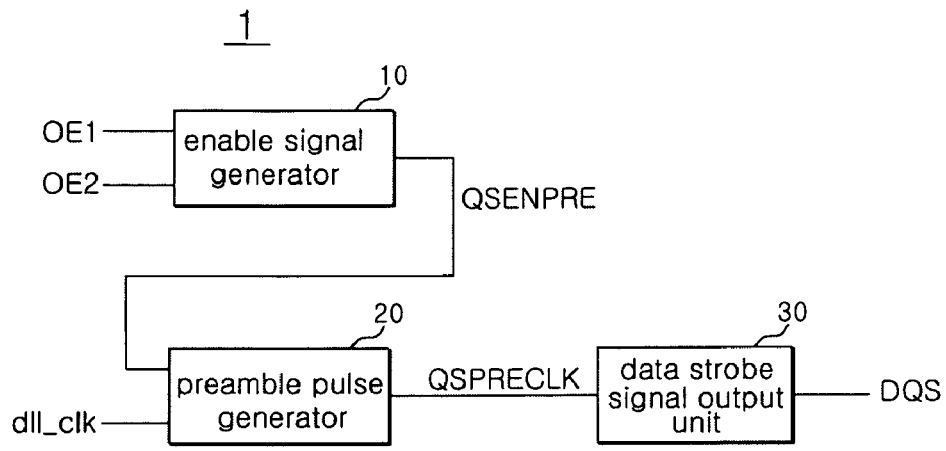
FIG. 1 is a schematic block diagram of a conventional data strobe signal generating device.
Figure 8:
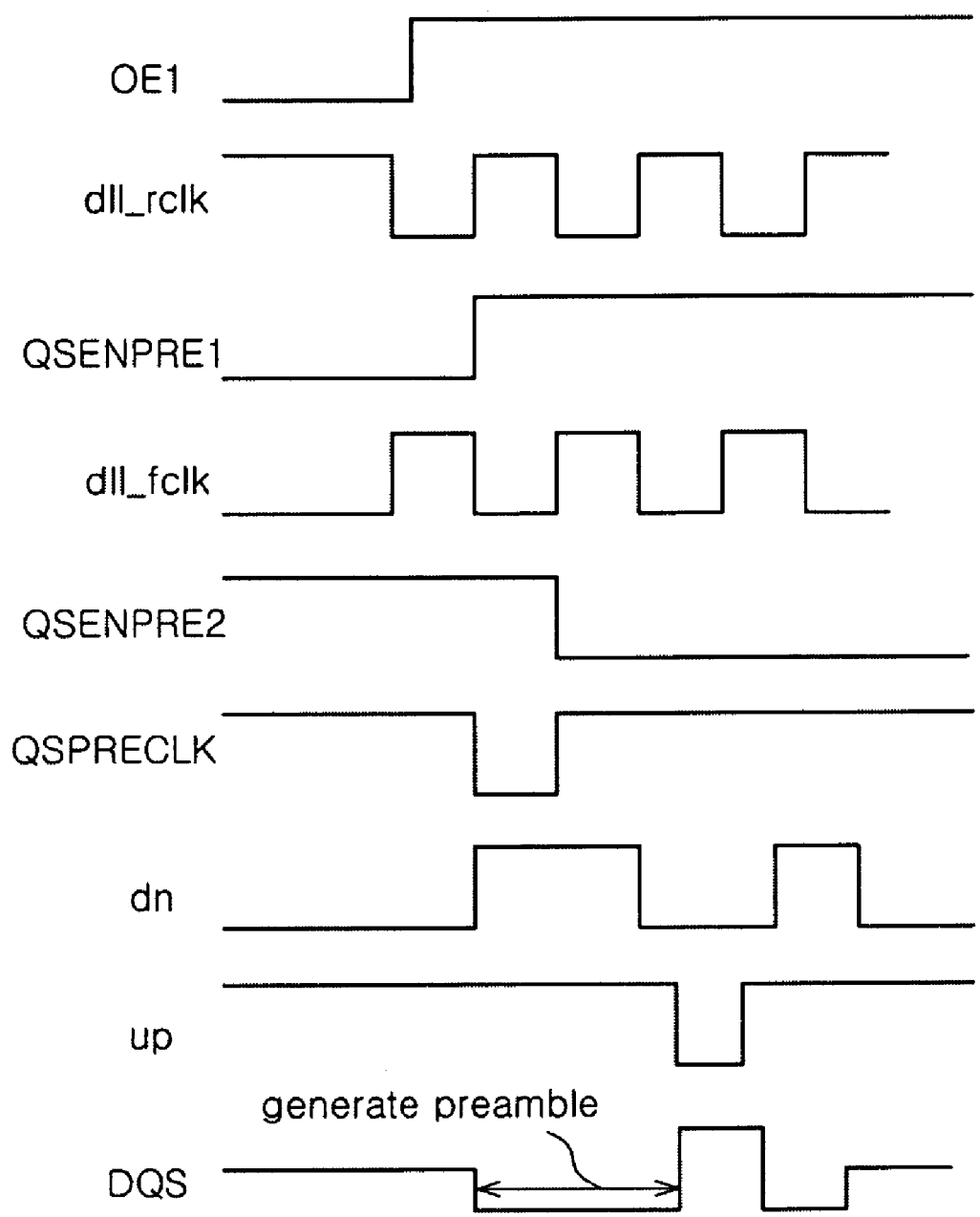
FIG. 8 is a timing chart demonstrating an exemplary operation of the data strobe signal generating device of FIG. 1 according to one embodiment.

FIG. 8 is a timing chart demonstrating an exemplary operation of the data strobe signal generating device of FIG. 1 according to one embodiment. In FIG. 8, an exemplary operation of the data strobe signal generating device 3 will be described with reference to FIGS. 2, 6, 7 and 8.

If a read command of a semiconductor memory apparatus is input, the output enable signals are generated at a predetermined unit time interval. Among the output enable signals, the output enable signal 'OE' enabled prior to the CAS latency by a predetermined time is input to the first enable time adjusting unit 110. Then, the first transmission unit 111 of the first enable time adjusting unit 110 allows the output enable signal 'OE' to pass therethrough at the rising edge of the first clock signal 'dll_rclk' input as the control signal, thereby generating the first enable signal 'QSENPRE1'. Accordingly, the first latch unit 112 of the first enable time adjusting unit 110 maintains the level of the first enable signal 'QSENPRE1'.

Next, the second transmission unit 121 of the second enable time adjusting unit 120 allows the first enable signal 'QSENPRE1' to pass therethrough at the rising edge of the second clock signal 'dll_fclk' input as the control signal. Then, the second latch unit 122 of the second enable time adjusting unit 120 inverts the output of the is second transmission unit 121, thereby generating the second enable signal 'QSENPRE2' and maintaining the level of the second enable signal 'QSENPRE2'.

Next, the preamble pulse generator 130 can receive the first and second enable signals 'QSENPRE1' and 'QSENPRE2' to generate the preamble signal 'QSPRECLK'. Here, the preamble pulse generator 130 includes the NAND gate ND as described above. Thus, if the first enable signal 'QSENPRE1' is enabled at a high level, since the second enable signal 'QSENPRE2' is enabled at a low level, then the preamble signal 'QSPRECLK' can be enabled at a low level from the time point at which the first enable signal 'QSENPRE1' is enabled at the high level to the time point at which the second enable signal 'QSENPRE2' is enabled at the low level.

Figure 2:
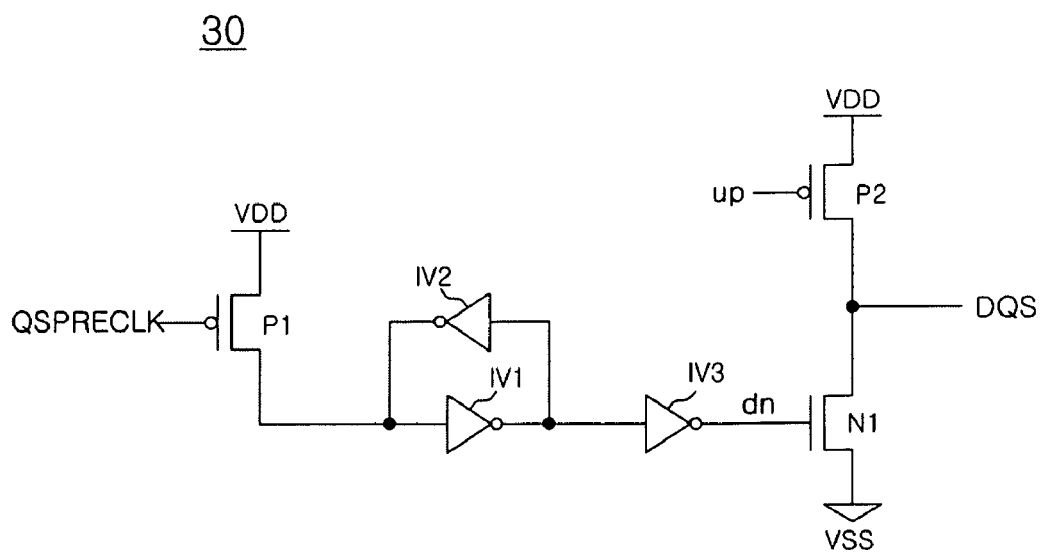
FIG. 2 is a schematic circuit diagram a conventional data strobe signal output unit of FIG. 1.
Figure 3:
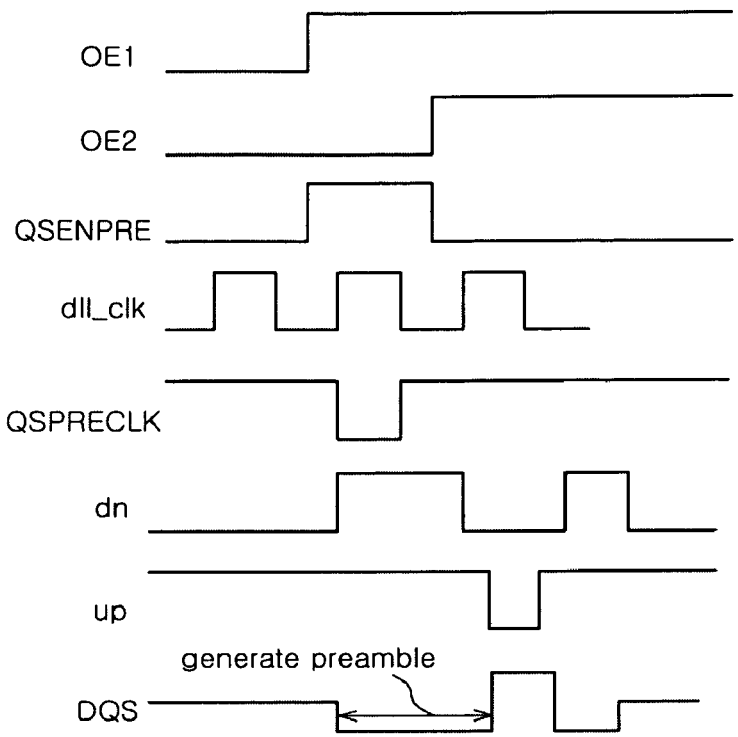
FIG. 3 is a timing chart of a conventional data strobe signal generating device of FIG. 1.
Figure 4:
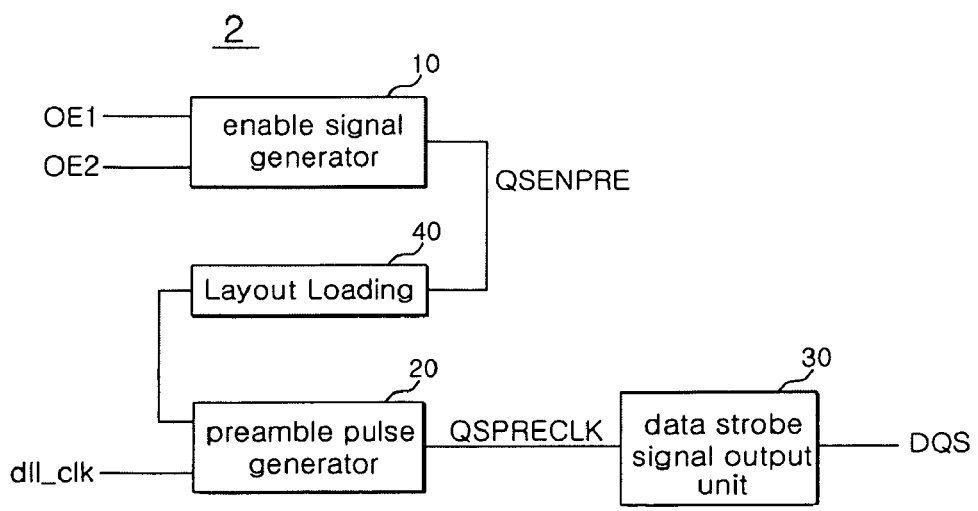
FIG. 4 is a schematic block diagram of a conventional data strobe signal generating device including a layout loading.
Figure 5:
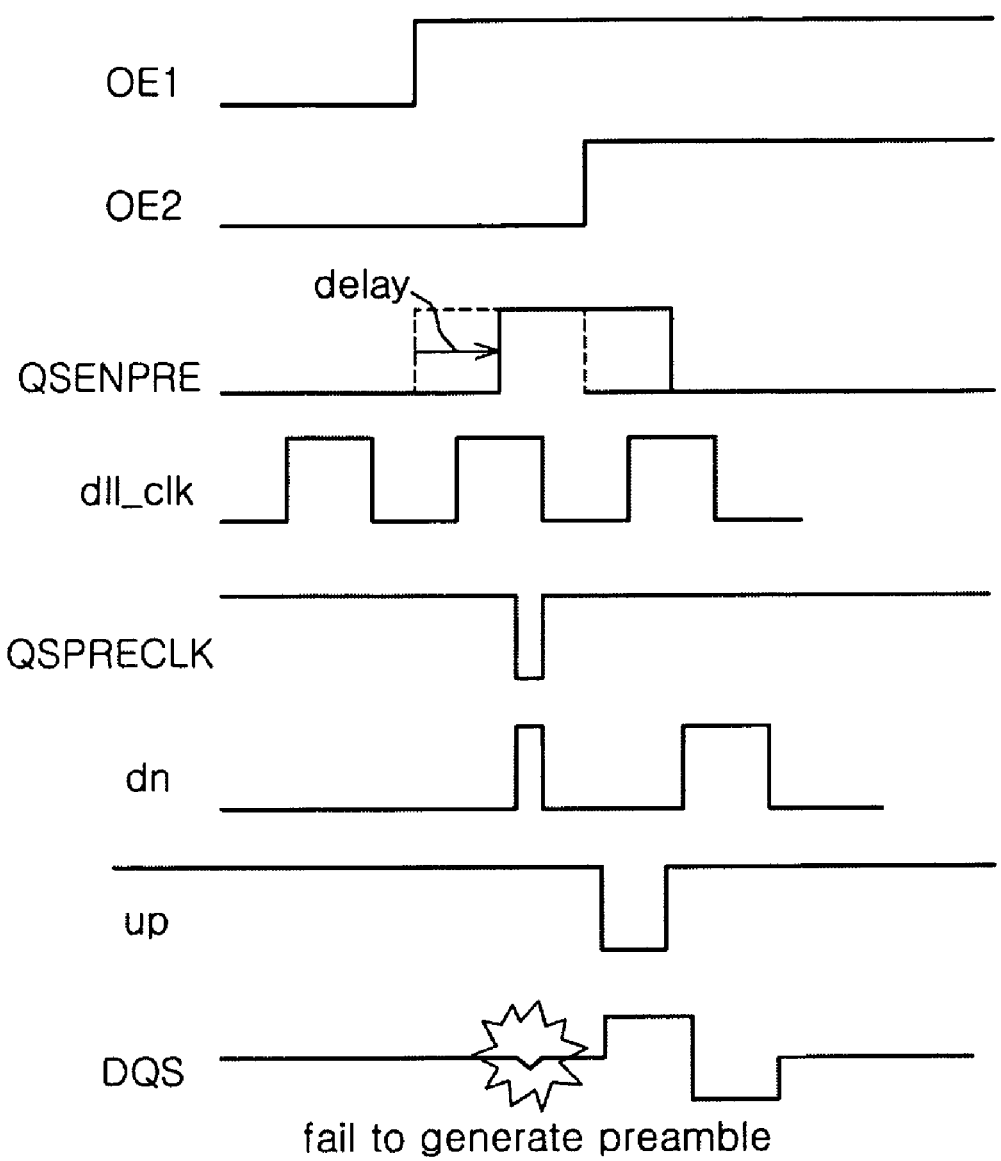
FIG. 5 is a timing chart of a conventional operation of the data strobe signal generating device of FIG. 4.

Referring to FIG. 2, the preamble signal 'QSPRECLK' generated from the preamble controller 100 is input to the data strobe signal output unit 30. Next, the first PMOS transistor P1 of the data strobe signal output unit 30 is turned ON in response to the preamble signal 'QSPRECLK', thereby allowing the down-signal 'dn' to be enabled at a high level. Then, the down-signal 'dn' turns ON the first NMOS transistor, so that the data strobe signal 'DQS' at a low to level can be generated. Here, the data strobe signal 'DQS' maintains the low level until the up-signal 'up' enabled based on the CAS latency is enabled, and an interval in which the data strobe signal 'DQS' maintains the low level refers to the preamble of the data strobe signal 'DQS'.

Accordingly, the preamble signal can be generated using the pair of DLL clock signals. Thus, the preamble signal having a predetermined pulse width can be generated regardless of PVT variations and layout loading.

While certain embodiments have been described above, it will be understood that the embodiments described are by way of example only. Accordingly, the device and methods described herein should not be limited based on the described embodiments. Rather, the device and methods described herein should only be limited in light of the claims that follow when taken in conjunction with the above description and accompanying drawings.

What is claimed is:

1. A semiconductor memory apparatus, comprising:
    a clock generator configured to generate first and second clock signals toggled in synchronization with an external clock signal; and
    a data strobe signal generator configured to receive an output enable signal and the first and second clock signals to generate a preamble signal enabled for a predetermined time, and to generate a data strobe signal in response to the preamble signal.

2. The semiconductor memory apparatus as claimed in claim 1, wherein the data strobe signal generator includes:
    an enable unit configured to receive the output enable signal, and first and second clock signals to generate first and second enable signals enabled at a predetermined time interval;
    a preamble pulse generator configured to receive the first and second enable signals to generate a preamble signal; and
    a data strobe signal output unit configured to receive the preamble signal to generate a data strobe signal.

3. The semiconductor memory apparatus as claimed in claim 2, wherein the enable unit includes:
    a first enable time adjusting unit configured to receive the output enable signal and the first clock signal to generate a first enable signal; and
    a second enable time adjusting unit configured to receive the first enable signal and the second clock signal to generate a second enable signal.

4. The semiconductor memory apparatus as claimed in claim 3, wherein the first enable time adjusting unit is configured to enable the first enable signal in synchronization with a rising edge of the first clock signal after the output enable signal is enabled.

5. The semiconductor memory apparatus as claimed in claim 3, wherein the second enable time adjusting unit is configured to enable the second enable signal in synchronization with a rising edge of the second clock signal after the first enable signal is enabled.

6. The semiconductor memory apparatus as claimed in claim 1, wherein the data strobe signal generator includes:
    a preamble controller configured to generate a preamble signal enabled in synchronization with the first clock signal and disabled in synchronization with the second clock signal after an output enable signal is enabled; and
    a data strobe signal output unit configured to generate a data strobe signal in response to the preamble signal.

7. The semiconductor memory apparatus as claimed in claim 6, wherein the preamble controller includes:
- a first enable time adjusting unit configured to receive the output enable signal and the first clock signal to generate a first enable signal;
- a second enable time adjusting unit configured to receive the first enable signal and the second clock signal to generate a second enable signal; and
- a preamble pulse generator configured to receive the first and second enable signals to generate the preamble signal.

8. The semiconductor memory apparatus as claimed in claim 7, wherein the first enable time adjusting unit is configured to enable the first enable signal in synchronization with a rising edge of the first clock signal after the output enable signal is enabled.

9. The semiconductor memory apparatus as claimed in claim 7, wherein the second enable time adjusting unit is configured to enable the second enable signal in synchronization with a rising edge of the second clock signal after the first enable signal is enabled.

10. The semiconductor memory apparatus as claimed in claim 7, wherein the preamble signal is enabled from a time point at which the first enable signal is enabled to a time point at which the second enable signal is enabled.

11. The semiconductor memory apparatus as claimed in claim 1, wherein the output enable signal is enabled prior to a CAS latency by a predetermined time.

* * * * *